(12) United States Patent
Cho et al.

(10) Patent No.: US 6,689,694 B1
(45) Date of Patent: *Feb. 10, 2004

(54) MICROMECHANICAL SYSTEM FABRICATION METHOD USING (111) SINGLE CRYSTALLINE SILICON

(75) Inventors: Dong-Il Cho, Seoul (KR); Sangwoo Lee, Seoul (KR); Sangjun Park, Seoul (KR)

(73) Assignee: Dong-Il Cho, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/715,446

(22) Filed: Nov. 17, 2000

Related U.S. Application Data

(63) Continuation of application No. 09/250,519, filed on Feb. 16, 1999, now Pat. No. 6,150,275.

(30) Foreign Application Priority Data

Apr. 1, 1998 (KR) ............................................. 98-11519

(51) Int. Cl.[7] ..................... H01L 21/311; H01L 21/302; C23F 1/00
(52) U.S. Cl. ........................ 438/696; 438/704; 438/712; 438/753; 216/2
(58) Field of Search ................................. 438/696, 694, 438/704, 705, 706, 748, 700, 701, 712, 739, 753; 216/2, 87

(56) References Cited

U.S. PATENT DOCUMENTS

| 5,195,371 A | 3/1993 | Greiff ........................... 73/505 |
| 5,594,172 A | 1/1997 | Shinohara ................. 73/514.33 |
| 5,725,785 A | 3/1998 | Ishida et al. .................... 216/2 |
| 5,882,532 A | 3/1999 | Field et al. ..................... 216/2 |
| 5,883,012 A | 3/1999 | Chiou et al. ................. 438/748 |
| 5,952,572 A | 9/1999 | Yamashita et al. ....... 73/504.04 |
| 5,962,784 A | 10/1999 | Hulsing, II .............. 73/504.03 |
| 5,966,066 A | 10/1999 | Mehregany et al. .......... 337/70 |
| 6,020,272 A | 2/2000 | Fleming |
| 6,150,275 A | * 11/2000 | Cho et al. .................... 438/696 |

OTHER PUBLICATIONS

Wolf et al., Silicon Processing for the VLSI Era, vol. 1: Process Technology, Lattice Press, Sunset Beach, CA, USA, pp. 1–5, 1986.*

Graham Ensell, "Free Standing Single–Crystal Silicon Microstructures," J. Micromech, Microeng. 5, pp. 1–4, 1995.

(List continued on next page.)

Primary Examiner—Nadine G. Norton
Assistant Examiner—Matthew A Anderson
(74) Attorney, Agent, or Firm—Schweitzer Cornman Gross & Bondell LLP

(57) ABSTRACT

Disclosed is a micromechanical system fabrication method using (111) single crystalline silicon as a silicon substrate and employing a reactive ion etching process in order to pattern a microstructure that will be separated from the silicon substrate and a selective release-etching process utilizing an aqueous alkaline solution in order to separate the microstructure from the silicon substrate. According to the micromechanical system fabrication method of the present invention, the side surfaces of microstructures can be formed to be vertical by employing the RIE technique. Furthermore, the microstructures can be readily separated from the silicon substrate by employing the selective release-etching technique using slow etching {111} planes as the etch stop in an aqueous alkaline solution. In addition, etched depths can be adjusted during the RIE step, thereby adjusting the thickness of the microstructure and the spacing between the microstructure and the silicon substrate.

23 Claims, 16 Drawing Sheets silicon   oxide   nitride   PR

OTHER PUBLICATIONS

Sangwoo Lee, et al., "A New Micromachining Technology Using (111) Silicon," Digest of Papers Microprocesses and Nanotechnology '98, 1998 International Microprocesses and Nanotechnology Conference, Kyungju, Korea, pp. 174–175, Jul. 13–16, 1998.

Bruce C. S. Chou, et al., "Anisotropic Etching of (111)–Oriented Silicon Applications," Part of the SPIE Conference on Micromachining and Microfabrication Process Technology IV, Santa Clara, California, SPIE, vol. 3511, pp. 337–341, Sep. 1998.

J. G. Fleming, "Combining the Best of Bulk and Surface Micromachining Using Si (111) Substrates," Part of the SPIE Conference on Micromachining and Microfabrication Process Technology IV Santa Clara, California, SPIE, vol. 3511, pp. 162–168, Sep. 1998.

Wolf et al. Silicon Processing For The VLSI Era Vol. 1: Process Technology, Lattice Press, Sunset Beach, A, USA, pp. 555, 1986.

* cited by examiner silicon    oxide    nitride    PR silicon    oxide    nitride    PR silicon    oxide    nitride    PR silicon    oxide    nitride    PR silicon    oxide    nitride    PR silicon    oxide    nitride    PR silicon   oxide   nitride   PR

MICROMECHANICAL SYSTEM FABRICATION METHOD USING (111) SINGLE CRYSTALLINE SILICON

This is a continuation application of copending U.S. patent application Ser. No. 09/250,519 filed on Feb. 16, 1999, now U.S. Pat. No. 6,150,275.

BACKGROUND OF THE INVENTION

1. Field of the Invention

The present invention relates to a micromechanical system and more particularly to a micromechanical system fabrication method using (111) single crystalline silicon.

2. Description of Related Art

A micromechanical system, also called micromachined system, is implemented by patterning and integrating particular portions of the system on a silicon substrate in a precise shape in micrometer scale using silicon fabrication processes. This is based upon semiconductor device fabrication techniques such as deposition of a thin film, etching, photolithography, and impurity diffusion and doping.

Micromechanical systems include the silicon accelerometers for sensing the acceleration of a moving body and the gyroscope for sensing the angular velocity of a rotating body.

Such micromechanical systems comprise of a moving parts and a stationary parts, which, when viewed on the cross section of the silicon substrate, are fabricated separated from the silicon substrate.

Conventionally the bulk micromachining method, in which a (100) single crystalline silicon or (110) single crystalline silicon is etched in an aqueous alkaline solution so as to fabricate a microstructure, and the surface micromachining method, in which polycrystalline silicon deposited on a silicon substrate is released at specified locations by a sacrificial layer etching technique, are used so as to fabricate a micromechanical system.

On the other hand, the present invention provides a micromachining method using (111) single crystalline silicon. In the present invention, micromachining method is also referred to as micromechanical system fabrication method.

FIG. 1 illustrates various planes of single crystalline silicon. FIG. 1 shows the (100), (110), and (111) planes in the single crystalline silicon, which has a cubic lattice structure.

Micromachining methods using the (100) single crystalline silicon or the (110) single crystalline silicon as the silicon substrate are conventionally well known. To use the (100) single crystalline silicon as the silicon substrate means to use a single crystalline silicon that is oriented in the direction of the (100) plane. This is implemented by using a silicon wafer that is cut from an ingot in the (100) plane during a wafer manufacturing process.

While the conventional micromachining methods using the (100) single crystalline silicon or the (110) single crystalline silicon are already well known, nothing about a micromachining method using (111) single crystalline silicon is known until now.

This is because studies on the crystallographic characteristics and the characteristics in fabrication steps with respect to the (111) single crystalline silicon, reflecting particular essential factors of a micromechanical system, different from the semiconductor device fabrication method, have not been actively conducted.

SUMMARY OF THE INVENTION

Accordingly, the present invention is directed to a method using the (111) single crystalline silicon to fabricate micromechanical systems that substantially obviates one or more of the limitations and disadvantages of the related art.

An objective of the present invention is to provide a micromechanical system fabrication method using (111) single crystalline silicon, wherein the crystallographic characteristics and characteristics in fabrication steps with respect to the (111) single crystalline silicon are utilized in fabricating a micromechanical system, thereby improving the micromachining technology.

Additional features and advantages of the invention will be set forth in the following description, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, a micromechanical system fabrication method using (111) single crystalline silicon, comprising: fabrication step, in which the (111) single crystalline silicon is utilized as a silicon substrate; reactive ion etching step, in which microstructures which have to be separated from the silicon substrate are patterned; and selective release-etching step, in which the microstructures are separated from the silicon substrate in an aqueous alkaline solution.

The step of reactive ion etching allows a thickness of the microstructures themselves and spacing between the silicon substrate and the microstructures separated from the silicon substrate to be defined and adjusted.

In the step of selective release-etching, the etch is selectively performed with respect to {100} planes and {110} planes, thus preventing the microstructures from being damaged, and the microstructures are readily separated from the silicon substrate due to slow etching characteristics of {111} planes that are left after the selective release-etching step in an aqueous alkaline solution.

The step of reactive ion etching comprises: a first reactive ion etching step of defining the thickness of the microstructures themselves; and a second reactive ion etching step of defining the spacing between the microstructures and the silicon substrate.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

With reference to the accompanying drawings, the present invention will now be described in detail.

Primarily, crystalline characteristics of the (111) single crystalline silicon are reviewed.

Figure 1:
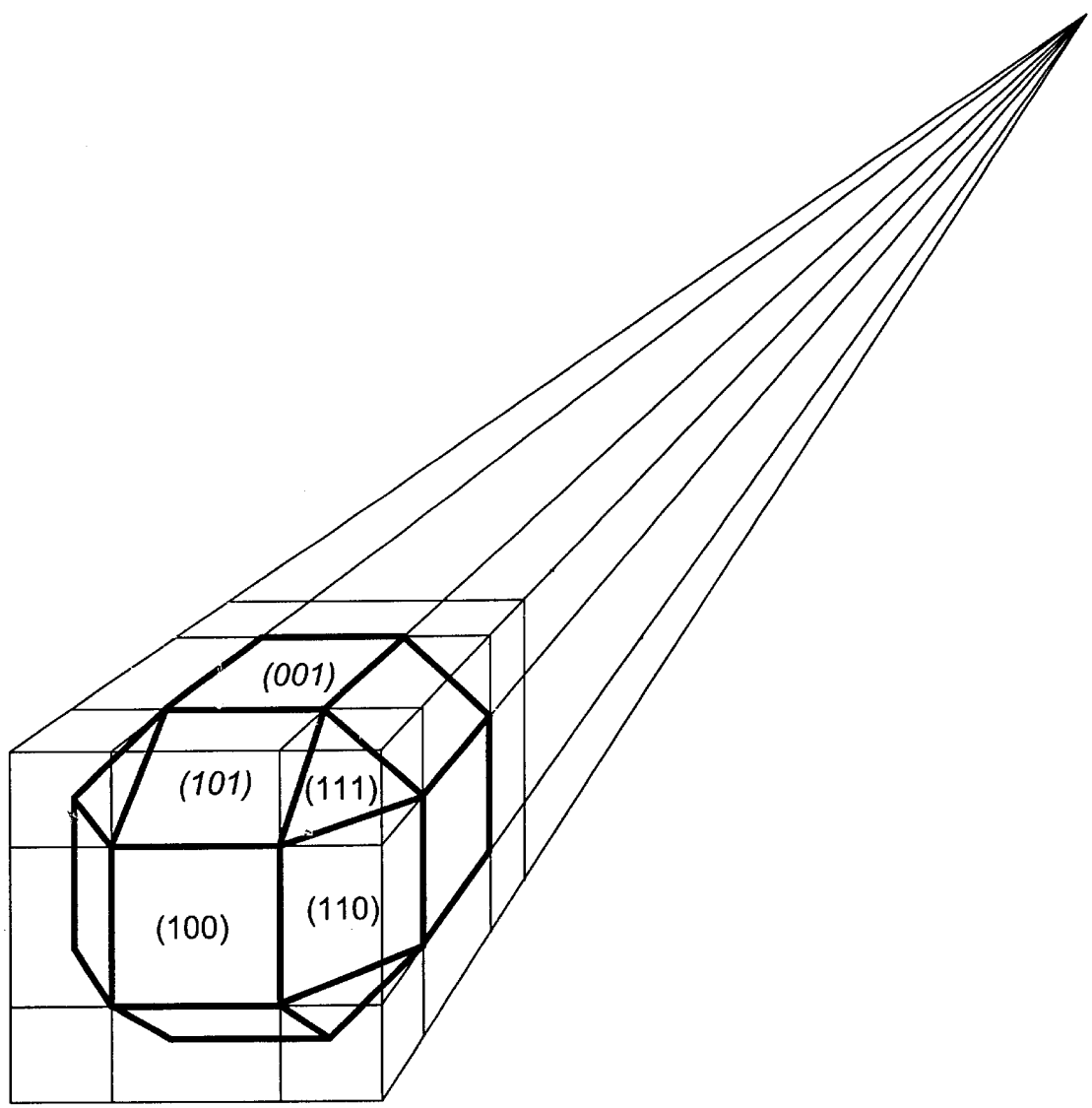
FIG. 1 illustrates planes of single crystalline silicon.
Figure 2A:
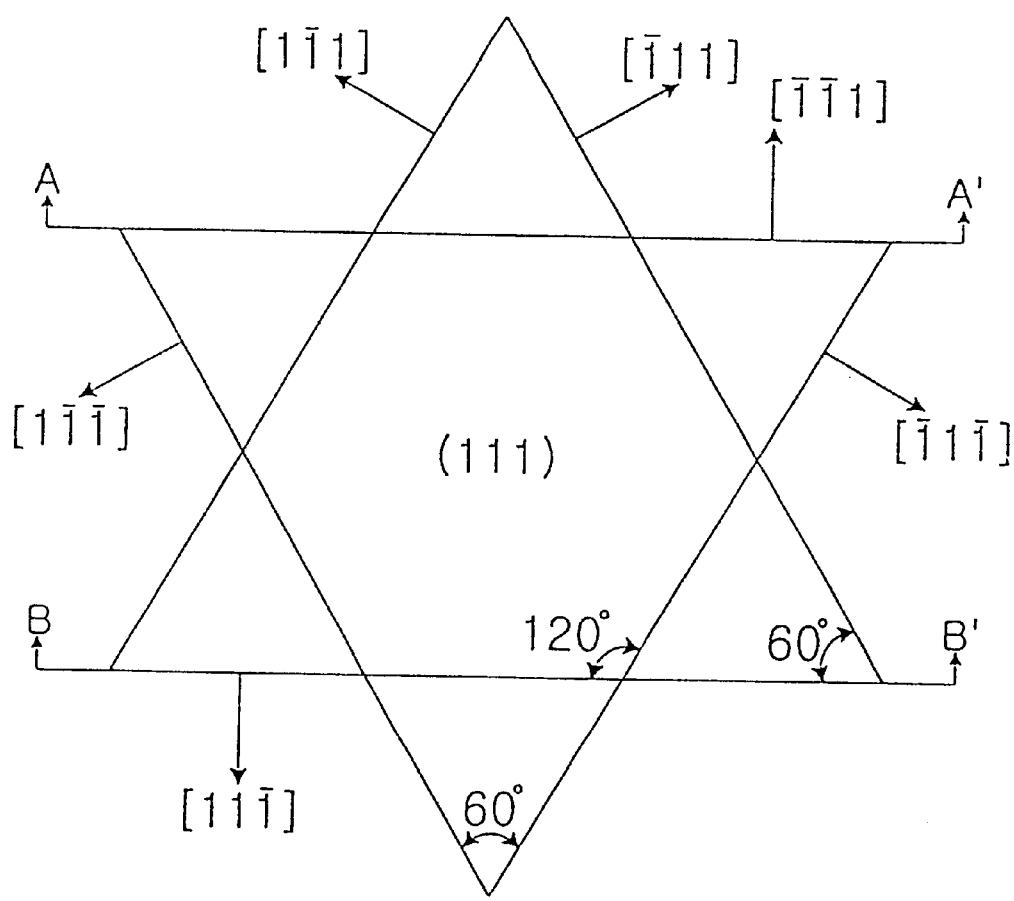
FIGS. 2a, 2b, 2c show {111} planes of (111) single crystalline silicon and their normal directions.
Figure 2B:
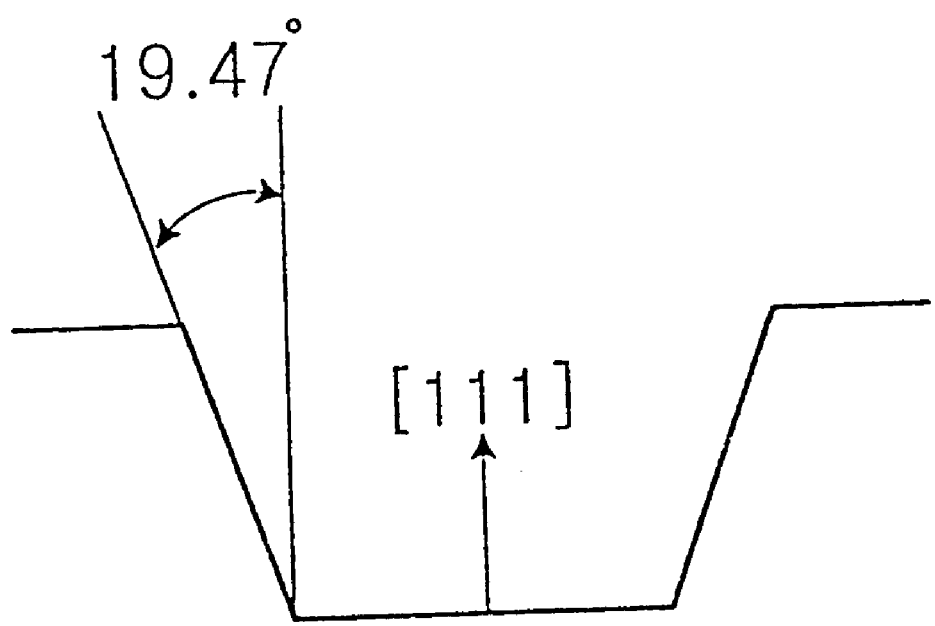
Figure 2C:
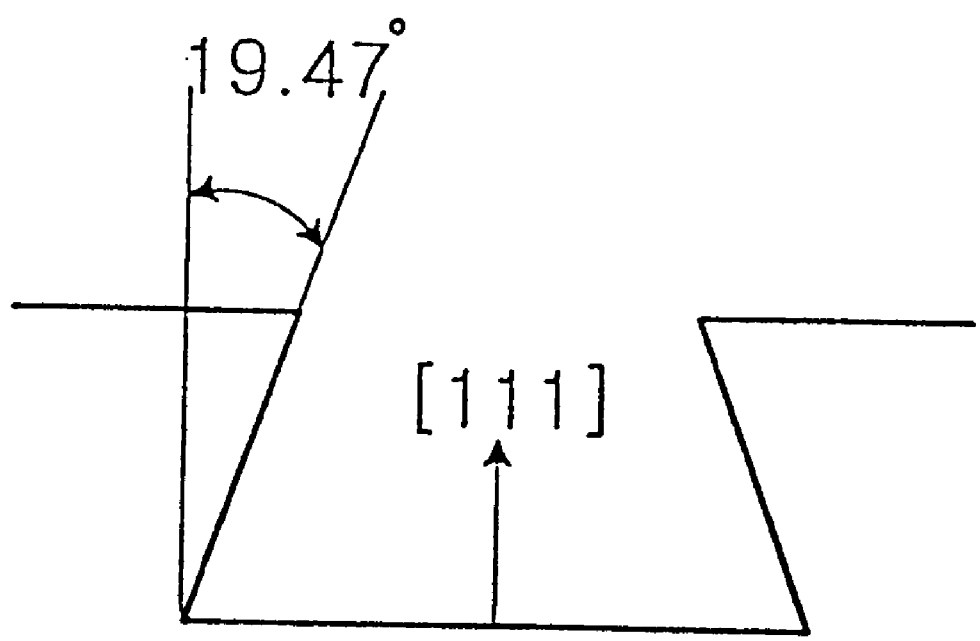

FIG. 2a shows two equilateral triangles surrounded by the {111} planes. FIG. 2b shows a cross sectional view taken along line A–A' showing other {111} planes. FIG. 2c shows a cross sectional view taken along line B–B' showing remaining {111} planes.

As shown in FIGS. 2b and 2c, the {111} planes slant against a [111] normal direction of the (111) planes at an angle of ±19.47°.

Because of this crystallographic orientation characteristic, when selectively etching the {100} planes and {110} planes with an aqueous alkaline solution and separating a microstructure from a silicon substrate in the micromechanical system fabrication method according to the present invention, the {111} planes which have been left after the etching step slant against the direction [111] at the angle of ±19.47°.

Figure 3:
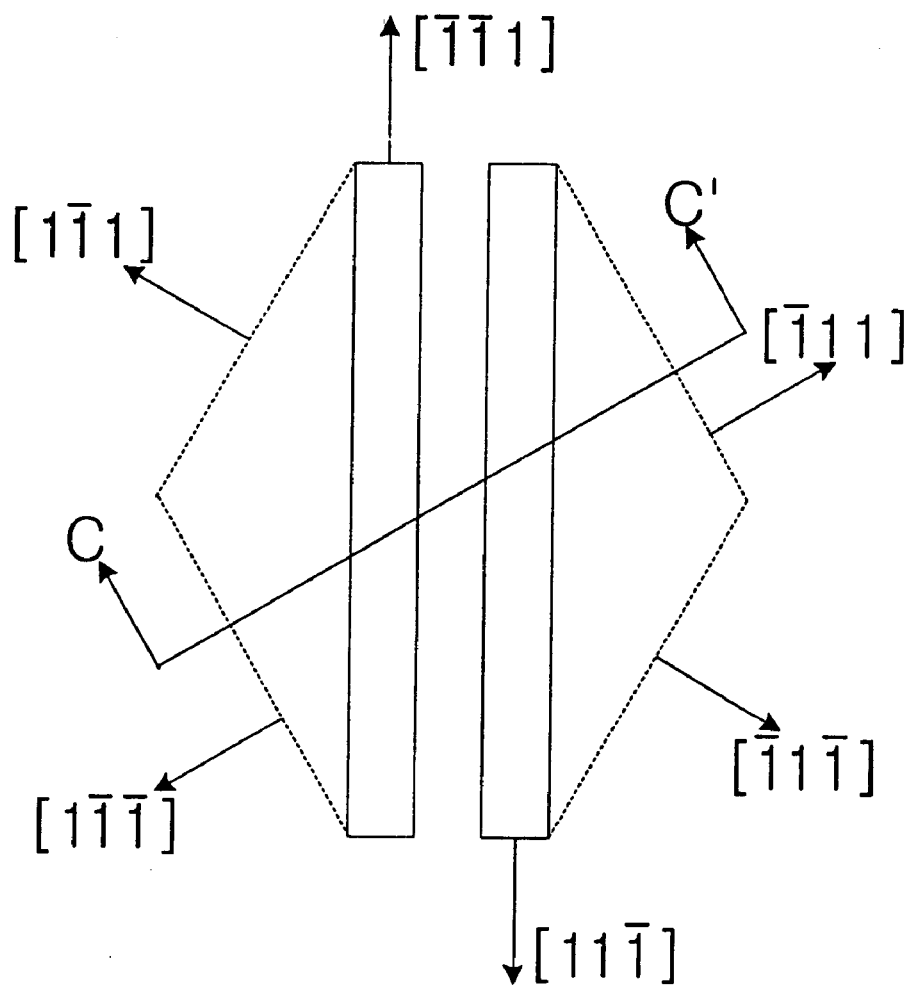
FIG. 3 is a plan view of a pattern fabricated in accordance with a micromechanical system fabrication method according to the present invention.

FIG. 3 is a plan view of a pattern fabricated in accordance with the micromechanical system fabrication method according to the present invention. FIGS. 4a to 4i are cross sectional views taken along line C–C' in FIG. 3 and show pattern fabrication steps.

FIG. 3 also shows the {111} planes of the (111) single crystalline silicon and their normal directions. Especially, dotted lines in FIG. 3 indicate normal directions of the {111} planes left after the wet etching step using an aqueous alkaline solution (see FIG. 4i).

Figure 4A:
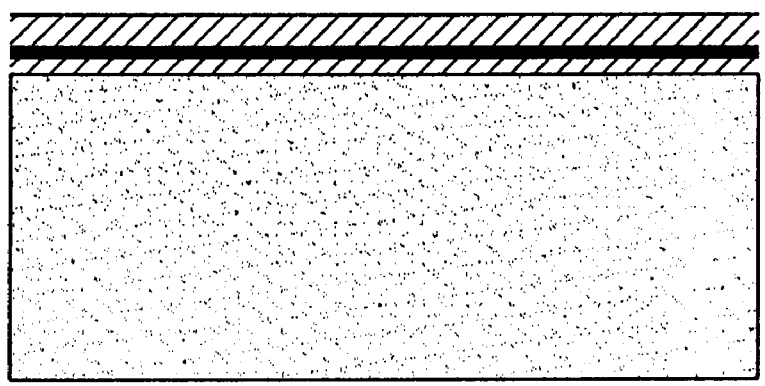
FIGS. 4a, 4b, 4c, 4d, 4e, 4f, 4g, 4h, 4i show steps for fabrication of the pattern depicted in FIG. 3.
Figure 4A:
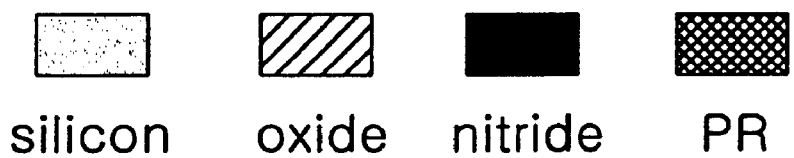
Figure 4B:
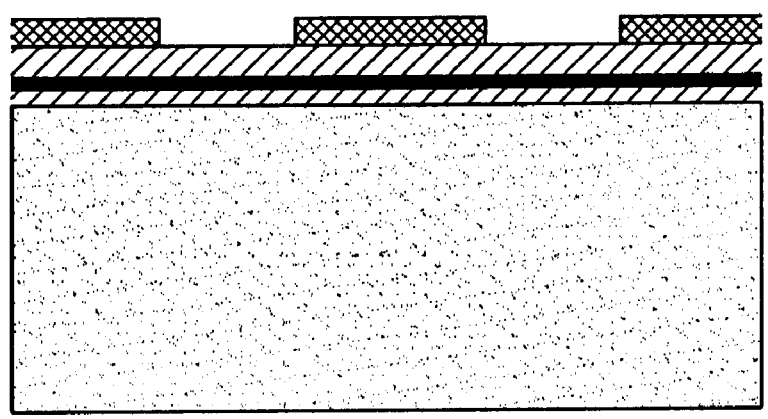
Figure 4B:
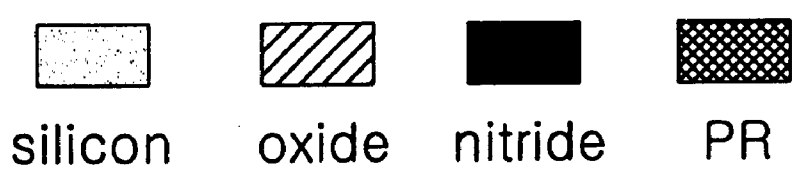

To fabricate the pattern depicted in FIG. 3, a buffer oxide layer, a nitride layer, and a mask oxide layer are formed on a (111) single crystalline silicon substrate as shown in FIG. 4a.

Figure 4C:
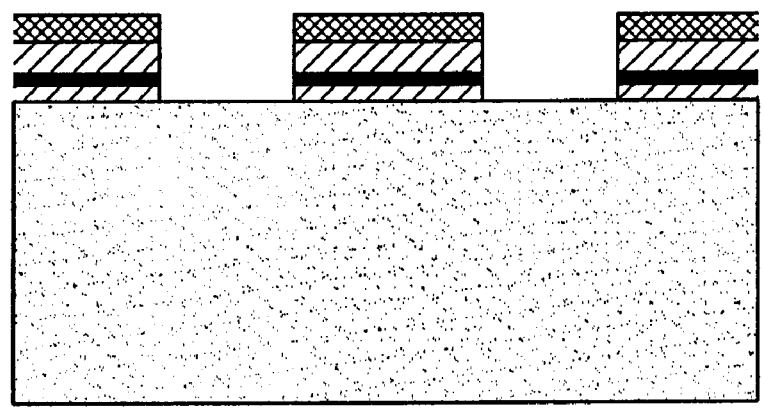
Figure 4C:
Figure 4C:
Figure 4C:
Figure 4C:
Figure 4D:
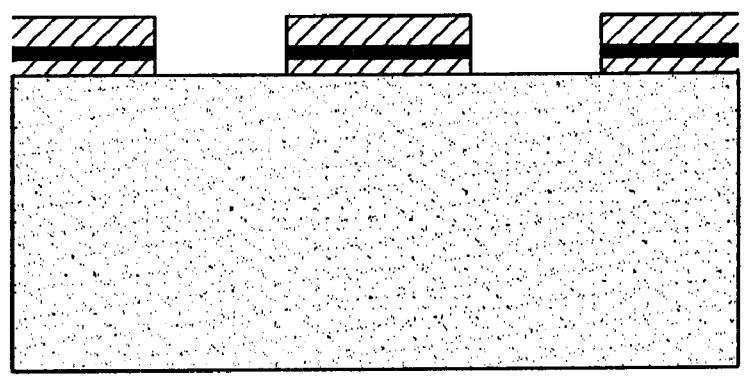
Figure 4D:
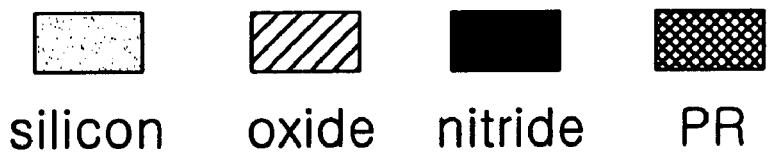

Photolithography etching process (FIG. 4b) is then carried out on the buffer oxide layer, nitride layer, and mask oxide layer. After patterning as shown in FIG. 4c, the photoresist layer is removed (FIG. 4d).

Figure 4E:
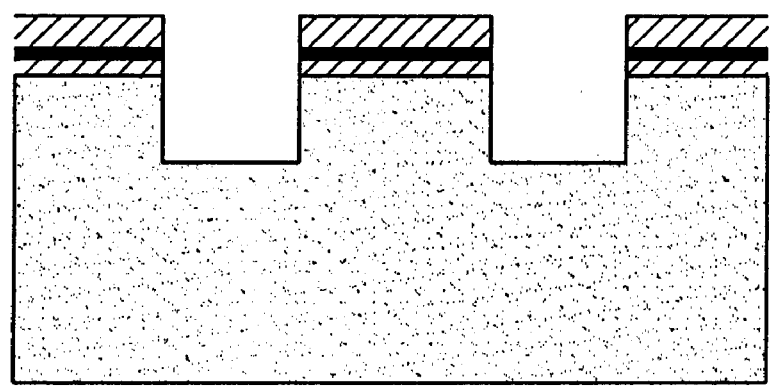
Figure 4E:
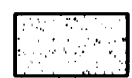
Figure 4E:
Figure 4E:
Figure 4E:

Subsequently, a reactive ion etching (RIE) process is carried out on the (111) silicon substrate (FIG. 4e). The etch is performed vertically on the silicon substrate as shown in FIG. 4e and an etched depth can be readily adjusted within the range from a sub-micrometer up to 500 µm in the RIE process. In FIG. 4e, the etched depth on the silicon substrate corresponds to a thickness of a microstructure itself that will be finally separated from the silicon substrate in the micromechanical system. In other words, since the etched depth in the silicon substrate can be adjusted by using the RIE process, the thickness of the microstructure itself separated from the silicon substrate can be easily controlled within the range from the sub-micrometer up to 500 µm in this micromechanical system.

Figure 4F:
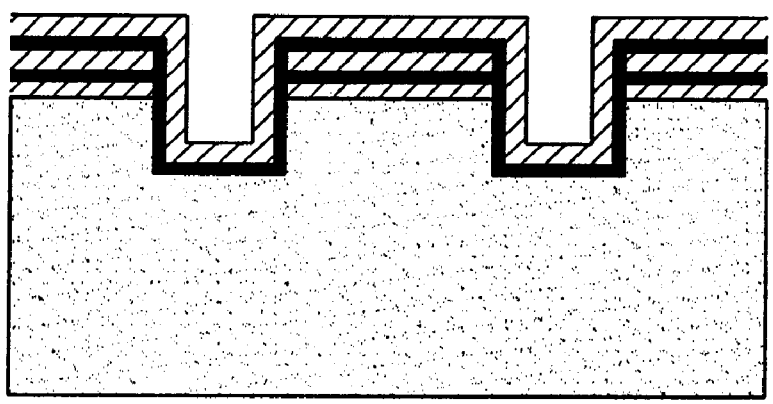
Figure 4F:
Figure 4F:
Figure 4F:
Figure 4F:
Figure 4G:
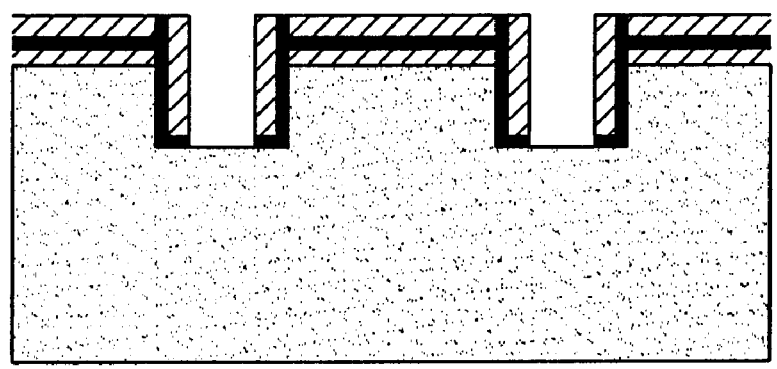
Figure 4G:
Figure 4G:
Figure 4G:
Figure 4G:

As illustrated above, the thickness of the microstructures are determined through the above first RIE step, and then a passivation step of overlaying protective films of the nitride layer and oxide layer is carried out (FIG. 4f). Subsequently, an other RIE process is performed with respect to the nitride layer and oxide layer as shown in FIG. 4g.

Figure 4H:
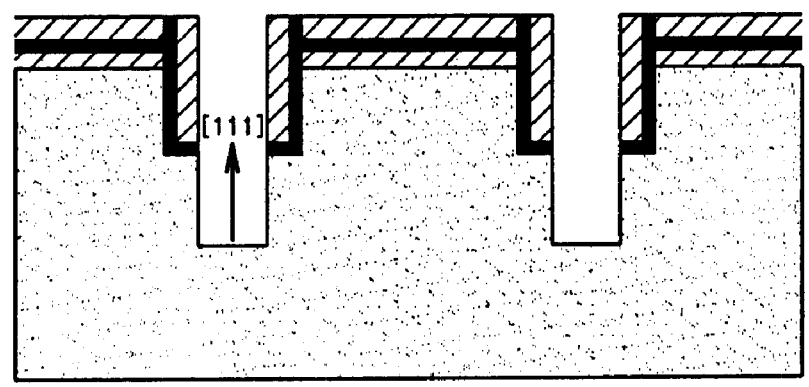
Figure 4H:
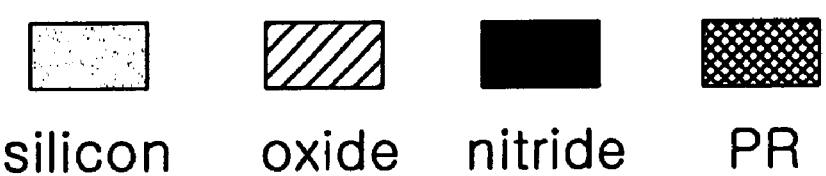

The second RIE process is also vertically carried out on the (111) silicon substrate (FIG. 4h). At this time, the etch is also performed vertically on the silicon substrate as shown in FIG. 4h, and the etched depth can be readily adjusted within the range from a sub-micrometer up to 500 µm in the RIE process. The etched depth shown in FIG. 4h corresponds to the spacing between the silicon substrate and the microstructures that will be finally separated from the silicon substrate in this micromechanical system. In other words, the etched depth on the silicon substrate can be controlled by using the RIE technique, thereby easily adjusting the spacing between the silicon substrate and the microstructures separated from the silicon substrate within the range from the sub-micrometer up to 500 µm in the micromechanical system.

Figure 4I:
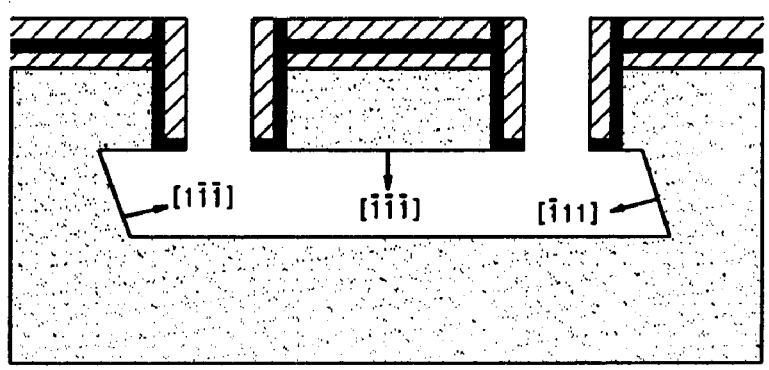
Figure 4I:
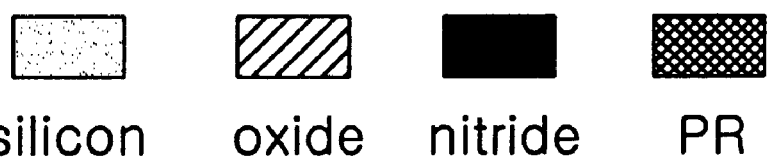

As illustrated above, after the spacing between the silicon substrate and the microstructures is determined through the second RIE step, a wet etching step is carried out using an aqueous alkaline solution (FIG. 4i). The microstructures are separated from the silicon substrate through this step, so this step can be defined as a release-etching step. In this release-etching step using an aqueous alkaline solution, the {100} planes and the {110} planes are selectively etched, but the {111} planes is not etched.

Therefore, the microstructures that have been formed with the (111) single crystalline silicon are not damaged during the release-etching step. More specifically, the etching process does not damage a bottom surface of the microstructure.

Additionally, the {111} planes of the silicon substrate, which are left after the release-etching step, are not rough as shown in FIG. 4i. The {111} planes left after the release-etching step slant against the [111] direction at an angle of ±19.47°, but this does not influence the microstructures separated from the silicon substrate. Since the etch is vertically carried out in the first RIE step as shown in FIG. 4e, the side surfaces of the microstructures are patterned to be vertical.

Such selective release-etching process also has an advantage of allowing the microstructure to be readily separated from the silicon substrate without additional etched holes.

Figure 5:
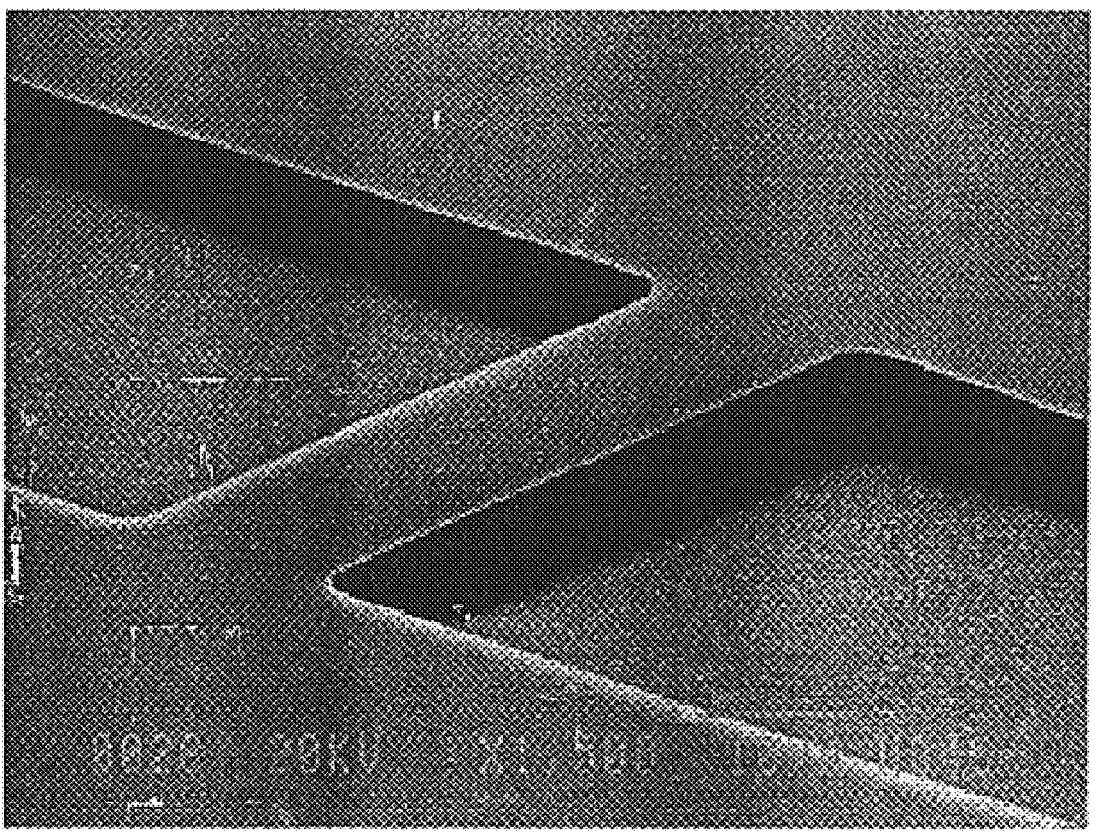
FIG. 5 is a scanning electron microscopic photograph of a microbridge fabricated in accordance with a micromechanical system fabrication method according to the present invention.

FIG. 5 is a scanning electron microscopic photograph of a microbridge fabricated in accordance with the micromechanical system fabrication method according to the present invention. The microbridge shown in FIG. 5 is formed to be 55 µm in length, 20 µm in width, and 4 µm in thickness. The spacing between the microbridge and the silicon substrate is 2 µm. The microbridge shown in FIG. 5 is formed by carrying out the RIE process on the (111) single crystalline silicon, so the side surfaces of the micro bridge are formed to be vertical.

Figure 6:
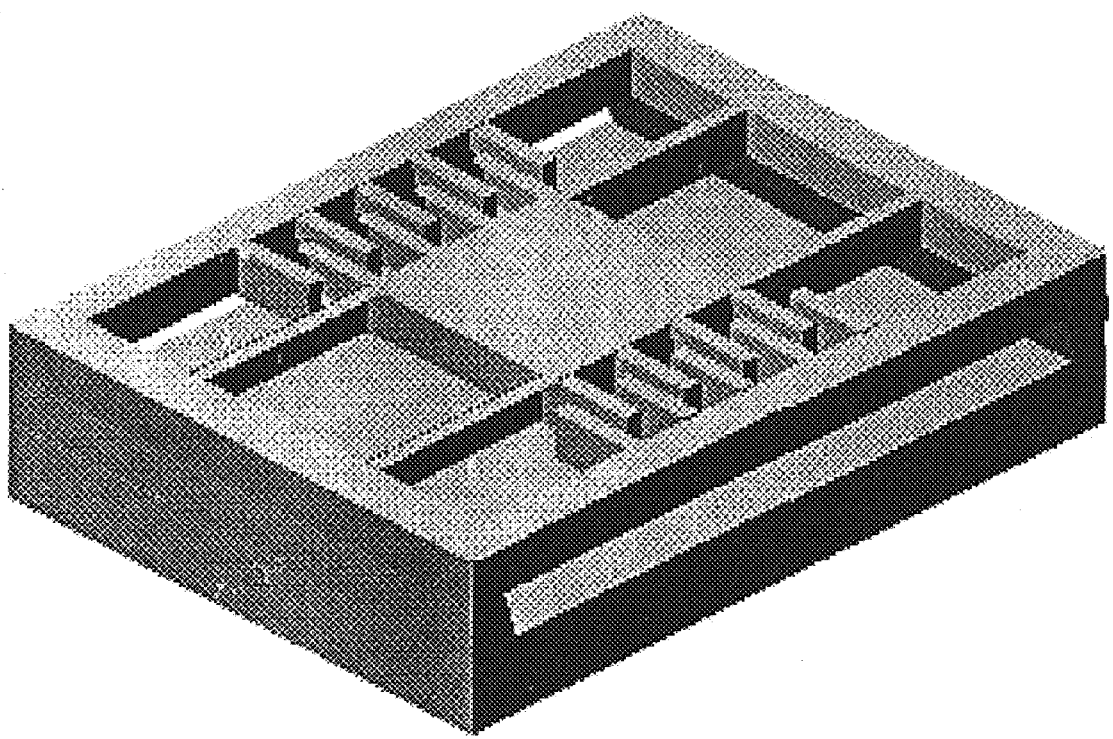
FIG. 6 illustrates a comb drive fabricated in accordance with a micromechanical system fabrication method according to the present invention.

The micromechanical system fabrication method using the (111) single crystalline silicon according to the present invention as illustrated above can be applied for various microstructures. FIG. 6 illustrates a comb drive fabricated in accordance with the micromechanical system fabrication method. In this comb drive structure, a moving beam in the form of tooth of a comb moves between tooth of a stationary beam that is also made in the form of tooth of a comb. Such movement of the moving beam causes change of spacing between the moving beam and the stationary beam. Based upon the change of the spacing between the two beams, change of capacitance of a plate capacitor composed of the moving and stationary beams can be sensed. According to the micromechanical system fabrication method using the (111) single crystalline silicon of the present invention, the side surfaces of microstructures such as the moving parts or the stationary parts can be formed to be vertical by using the RIE technique. Furthermore, the microstructures can be readily separated from the silicon substrate by employing the selective release-etching technique using slow etching {111} planes as the etch stop in an aqueous alkaline solution. In addition, the etched depth can be arbitrarily defined during the RIE step, thereby arbitrarily defining the thickness of the microstructures and the spacing between the microstructures and the silicon substrate.

It will be apparent to those skilled in the art that various modifications and variations can be made in the micromechanical system fabrication method using (111) single crystalline silicon of the present invention without deviating from the spirit or scope of the invention. Thus, it is intended that the present invention covers the modifications and variations of this invention provided they come within the scope of the appended claims and their equivalents.

What is claimed is:

1. A method of forming a micromechanical system, the method comprising:
   providing a (111) silicon substrate;
   etching into the (111) silicon substrate to a depth to define a thickness of a silicon microstructure, wherein the etching forms walls;
   covering at least a portion of the walls with an etch stop layer;
   further etching through the etch stop layer and into the (111) silicon substrate using at least a portion of the etch stop layer to define a lateral extent of the further etching into the (111) silicon substrate; and
   selective etching along at least one {100} plane or at least one {110} plane to separate the silicon microstructure from the (111) silicon substrate, the selective etching guided by one or more {111} planes, the selective etching proceeding between the silicon microstructure and the substrate to release the silicon microstructure.

2. The method of claim 1, wherein the selective etching terminates in part on a [$\bar{1}$11] or [1$\bar{1}$$\bar{1}$] face of the silicon substrate.

3. The method of claim 1, wherein the selective etching terminates in part on a [$\bar{1}$11] face of the silicon substrate.

4. The method of claim 1, wherein the selective etching terminates in part on a [1$\bar{1}$$\bar{1}$] face of the silicon substrate.

5. The method of claim 1, wherein a lower, released surface of the silicon microstructure is substantially parallel to a surface of the silicon substrate.

6. The method of claim 1, wherein the lower, released surface of the silicon microstructure is a [1$\bar{1}$1] face.

7. The method of claim 6, wherein the silicon microstructure is one beam of a comb drive structure.

8. The method of claim 1, wherein the selective etching includes an etch in an alkaline solution.

9. The method of claim 1, wherein the etch stop layer protects at least a portion of the silicon microstructure during the selective etching.

10. The method of claim 1, wherein the covering comprises overlaying a first layer over surfaces of the (111) silicon substrate exposed in the etching and overlaying a second layer over the first layer, and
   wherein the further etching includes removing portions of the first and second layers to expose the (111) silicon substrate, wherein the further etching is performed through the opening created by the removing.

11. The method of claim 10, wherein the etching is part of a photolithography process and is a reactive ion etching process.

12. The method of claim 10, wherein the etch stop layer protects at least a portion of the silicon microstructure during the selective etching and the walls define opposing edges of the silicon microstructure.

13. The method of claim 10, wherein the first layer is silicon nitride and the second layer is silicon oxide.

14. The method of claim 13, wherein the removing includes a reactive ion etching process.

15. A method of forming a micromechanical system, the method comprising:
   providing a (111) silicon substrate;
   etching into the (111) silicon substrate to a depth to define a portion of a silicon microstructure, wherein the etching forms walls;
   covering at least a portion of the walls with an etch stop layer;
   anisotropic etching through the etch stop layer into the (111) silicon substrate using at least a portion of the etch stop layer to define a size of at least one opening in the etch stop layer created by the anisotropic etching; and
   selective etching to separate a silicon microstructure from the (111) silicon substrate, the selective etching being guided by one or more etch-resistant {111} planes, the selective etching proceeding between the silicon microstructure and the (111) silicon substrate to release the silicon microstructure, the etch stop layer limiting the selective etching of at least a portion of the silicon microstructure during the selective etching.

16. The method of claim 15, wherein the selective etching includes an etch in an alkaline solution.

17. The method of claim 15, wherein the selective etching includes an etch in an alkaline solution.

18. The method of claim 15, wherein the walls define one or more edges of the silicon microstructure.

19. The method of claim 15, wherein the covering comprises overlaying a first layer over surfaces of the (111) silicon substrate exposed in the etching and overlaying a second layer over the first layer; and
   wherein the anisotropic etching includes removing portions of the first and second layers to expose the (111) silicon substrate, wherein the anisotropic etching is performed through the opening created by the removing.

20. The method of claim 19, wherein the first layer is silicon nitride and the second layer is silicon oxide.

21. The method of claim 15, wherein the etch stop layer protects at least a portion of the silicon microstructure during the selective etching.

22. The method of claim 21, wherein the removing includes a reactive ion etching process.

23. The method of claim 15, wherein the walls define opposing edges of the silicon microstructure.

* * * * *